United States Patent
Langhammer et al.

(10) Patent No.: US 9,235,540 B1
(45) Date of Patent: Jan. 12, 2016

(54) FLEXIBLE HIGH SPEED FORWARD ERROR CORRECTION (FEC) PHYSICAL MEDIUM ATTACHMENT (PMA) AND PHYSICAL CODING SUBLAYER (PCS) CONNECTION SYSTEM

(71) Applicant: Altera Corporation, San Jose, CA (US)

(72) Inventors: Martin Langhammer, Salisbury (GB); Haiyun Yang, San Jose, CA (US); Peng Li, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 327 days.

(21) Appl. No.: 13/781,839

(22) Filed: Mar. 1, 2013

(51) Int. Cl.
*G06F 13/14* (2006.01)
*G06F 13/36* (2006.01)
*G06F 13/40* (2006.01)
*H03M 7/00* (2006.01)
*H04L 27/00* (2006.01)

(52) U.S. Cl.
CPC ............ *G06F 13/36* (2013.01); *G06F 13/4022* (2013.01); *G06F 13/4027* (2013.01); *H03M 7/00* (2013.01); *H04L 27/00* (2013.01)

(58) Field of Classification Search
CPC ............................... H03M 13/00; G06F 13/14
USPC .......... 710/69–72, 100, 305, 326; 341/50–59
See application file for complete search history.

(56) References Cited

U.S. PATENT DOCUMENTS

| | | | |
|---|---|---|---|
| 5,107,503 A * | 4/1992 | Riggle et al. .................... | 714/784 |
| 6,501,396 B1 * | 12/2002 | Kryzak et al. ................... | 341/59 |
| 6,525,678 B1 * | 2/2003 | Veenstra et al. ................ | 341/55 |
| 6,658,605 B1 * | 12/2003 | Yoshida et al. ................ | 714/702 |
| 7,119,732 B1 * | 10/2006 | Lam et al. ....................... | 342/27 |
| 7,131,024 B1 * | 10/2006 | Venkata et al. ................ | 713/500 |
| 8,572,300 B2 * | 10/2013 | Wu et al. .......................... | 710/52 |
| 2010/0202556 A1 * | 8/2010 | Chiabrera ....................... | 375/295 |
| 2014/0075076 A1 * | 3/2014 | Pillai et al. ...................... | 710/305 |

* cited by examiner

*Primary Examiner* — Brian Misiura
*Assistant Examiner* — Jasper J Harris
(74) *Attorney, Agent, or Firm* — Ropes & Gray LLP

(57) ABSTRACT

Systems, methods, apparatus, and techniques relating to a transmitter interface are disclosed. A soft-IP transmitter interface includes a Reed-Solomon encoder operating according to any one of multiple bus width and bandwidth parameter pairs, and a gearbox module that includes multiple gearboxes. The multiple gearboxes receive input data at a bus width and clock rate parameter pair specified by the soft-IP transmitter interface and convert the input data into output data according to a number of physical lanes and bandwidth parameter pair specified by a physical medium attachment (PMA) standard.

18 Claims, 8 Drawing Sheets

FLEXIBLE HIGH SPEED FORWARD ERROR CORRECTION (FEC) PHYSICAL MEDIUM ATTACHMENT (PMA) AND PHYSICAL CODING SUBLAYER (PCS) CONNECTION SYSTEM

BACKGROUND OF THE INVENTION

A physical coding sublayer (PCS) interface included within a device processes data for transmission to, and data that is received from, a physical medium attachment (PMA) coupled to an external device. Such a PCS interface is often designed to support a particular PMA standard and new standards continue to emerge. For example, the 802.3bj Ethernet standard defines a PMA that uses four physical lanes at a line rate of 25.78 gigabits per second (Gbps) each for Pulse Amplitude Modulation 2 (PAM-2). The bandwidth requirements of this and other emerging standards make the design of practical soft IP PCS architectures a challenge.

SUMMARY OF THE INVENTION

Systems, methods, apparatus, and techniques relating to a transmitter interface are disclosed. A soft-IP transmitter interface comprises a Reed-Solomon encoder operating according to any one of a plurality of bus width and bandwidth parameter pairs and a gearbox module comprising a plurality of gearboxes. The plurality of gearboxes receive input data at a bus width and clock rate parameter pair specified by the transmitter interface and convert the input data into output data according to a number of physical lanes and bandwidth parameter pair specified by a PMA standard.

In some implementations, the plurality of bus width and bandwidth parameter pairs comprises a bus width of 66 symbols and a clock rate of 156.3 MHz, a bus width of 44 symbols and a clock rate of 234.4 MHz, a bus width of 33 symbols and a clock rate of 312.5 MHz, and a bus width of 22 symbols and a clock rate of 468.8 MHz. In some implementations, the PMA standard specifies the number of physical lanes to be four physical lanes and bandwidth parameter of 25.78 Gigabits per second per physical lane. In some implementations, a bus width specified by the transmitter interface is not divisible by a total number of physical lanes included in the gearbox module.

In some implementations, the plurality of gearboxes comprises a first subplurality of gearboxes and a second subplurality of gearboxes, where, during even clock cycles, each gearbox in the first subplurality of gearboxes outputs a total number of N bits and each gearbox in the second subplurality of gearboxes outputs a total number of N+1 bits. In some implementations, during odd clock cycles, each gearbox in the first subplurality of gearboxes outputs a total number N+1 of bits, and each gearbox in the second subplurality of gearboxes outputs a total number N of bits.

Systems, methods, apparatus, and techniques for configuring a PCS interface of an integrated circuit device are also disclosed. A device size or area requirement for a portion of the integrated circuit is determined, a plurality of operating parameters of the PCS interface are selected based on the device size or area requirement, and the PCS interface is configured based on the plurality of operating parameters, where configuring the PCS interface comprises determining if a bus width of the PCS interface is divisible by a total number of physical lanes present in the PCS interface.

In some implementations, the plurality of operating parameters comprises a maximum bandwidth parameter for the PCS interface. In some implementations, the maximum bandwidth parameter is selected from the group consisting of 156.3 MHz, 234.4 MHz, 312.5 MHz, and 468.8 MHz. In some implementations, the device size or area requirement is a bus width of an encoder or decoder included in the integrated circuit. In some implementations, the bus width is selected from the group consisting of 22 symbols, 33 symbols, 44 symbols, and 66 symbols. In some implementations, configuring the PCS interface comprises configuring the gearboxes present in the PCS interface in an elastic gearbox design in response to a determination that the bus width of the PCS interface is not divisible by the number of gearboxes present in the PCS interface.

Systems, methods, apparatus, and techniques relating to a soft-IP receiver interface are disclosed. The soft-IP receiver interface includes a Reed-Solomon decoder operating according to any one of a plurality of bus width and bandwidth parameter pairs and a gearbox module comprising a plurality of gearboxes. The plurality of gearboxes receive input data on a number of physical lanes and at a bandwidth per physical lane specified by a PMA standard, and convert the input data into output data at a bus width and a clock rate specified by a soft-IP receiver interface.

In some implementations, the plurality of bus width and bandwidth parameter pairs comprises a bus width of 66 symbols and a clock rate of 156.3 MHz, a bus width of 44 symbols and a clock rate of 234.4 MHz, a bus width of 33 symbols and a clock rate of 312.5 MHz, and a bus width of 22 symbols and a clock rate of 468.8 MHz. In some implementations, the PMA standard specifies the number of physical lanes to be four physical lanes and bandwidth parameter of 25.78 Gigabits per second per physical lane. In some implementations, a bus width specified by the receiver interface is not divisible by a total number of physical lanes included in the gearbox module.

In some implementations, the plurality of gearboxes comprises a first subplurality of gearboxes and a second subplurality of gearboxes, wherein, during even clock cycles, each gearbox in the first subplurality of gearboxes outputs a total number of N bits and each gearbox in the second subplurality of gearboxes outputs a total number of N+1 bits. In some implementations, during odd clock cycles, each gearbox in the first subplurality of gearboxes outputs a total number N+1 of bits and each gearbox in the second subplurality of gearboxes outputs a total number N of bits. In some implementations, the interface comprises a transcoding decoder for processing block data from a plurality of virtual lanes according to a round-robin allocation.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

This disclosure relates to a programmable soft IP device interface for use in a device, especially a programmable logic device (PLD), which is operable to connect to a standardized 103.125 Gbps PMA. Specifically, the soft IP device interface is user programmable to operate according to different degrees of parallelism and corresponding maximum device operating frequencies. As such, the programmability allows a designer to tradeoff a device size of the interface with a maximum operating frequency. This disclosure also relates to a hard IP interface for use in a device, especially a PLD or application specific integrated circuit (ASIC), which is operable to connect to the standardized 103.125 Gbps PMA. Further aspects of the disclosed methods, systems, and apparatus are described in detail below.

The terms gearbox and gearbox module as referred to herein describe logic (e.g., circuitry) for translating a first data rate and/or data width at an input to the logic into a second data rate and/or data width at the output of the logic. As an illustrative example, a gearbox may receive data at an input width of 66 bits per virtual channel (and also referred to as a virtual lane) and may convert this data to a width of 40 bits per virtual channel at an output of the gearbox. Further, a total number of virtual channels at the output of a gearbox may be different from a total number of virtual channels at the input to the gearbox. Data may be input to a gearbox according to a first data clock and output from the gearbox according to a second (e.g., faster or slower) data clock.

Figure 1:
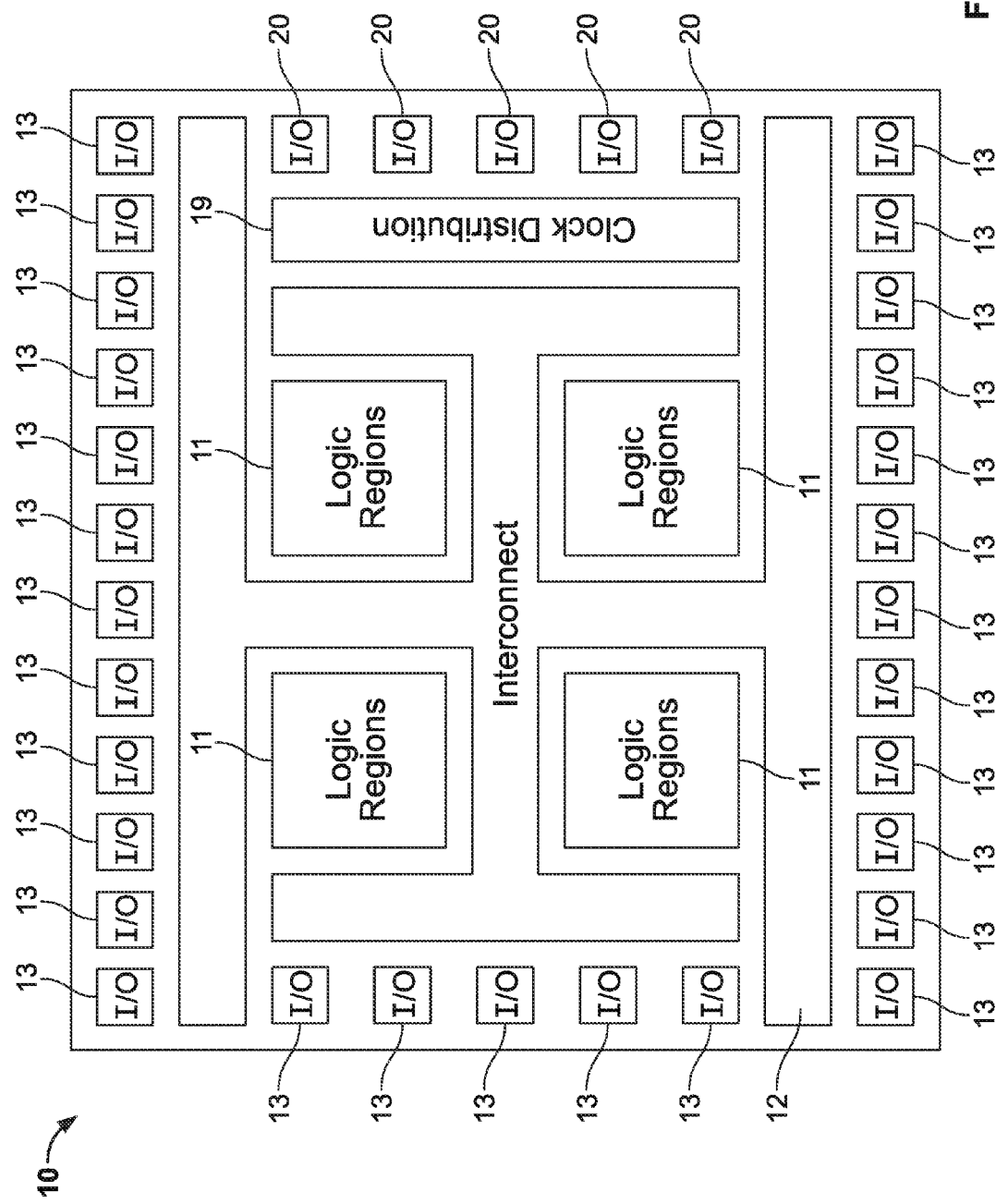
FIG. 1 is an illustrative block diagram of a programmable device including an interface in accordance with an arrangement.

A PLD 10, shown schematically in FIG. 1, is one example of a programmable device including an interface incorporating the invention. The PLD 10 has a programmable logic core including programmable logic regions 11 accessible to a programmable interconnect structure 12. The layout of the logic regions 11 and the interconnect structure 12 as shown in FIG. 1 is intended to be schematic only, as many actual arrangements are known to, or may be created by, those of ordinary skill in the art.

The PLD 10 includes a clock distribution area 19. The clock distribution area 19 includes one or more clock signals from which clock signals are provided to various other elements of the PLD 10. In an arrangement, the clock distribution area 19 includes at least one clock signal that operates at a speed greater than or equal to the highest clock speed requirement by any component of the PLD 10.

The PLD 10 also includes a plurality of other input-output (I/O) regions, referred to as I/O regions 13. Each of the regions in the I/O regions 13 is preferably programmable, allowing the selection of one of a number of possible signaling schemes. Alternatively, each of the I/O regions 13 may be fixed and allow only a particular signaling scheme. Each of the I/O regions 20 is preferably a high-speed interface, preferably including a plurality of PCS transmit and receive channels. Various architectures of PCS transmit and receive channels are described below. In one arrangement, each of the I/O regions 20 implements an identical PCS transmit and receive channel architecture. In another arrangement, the various I/O regions 20 generally implement different PCS transmit and receive channel architectures.

Aspects of a design of a PCS transmit and receive architecture consistent with the IEEE 802.3bj standard, and other standards, are described next. The standard specifies the use of PAM-2 or PAM-4 modulation. When PAM-2 is used, the standard further specifies use of a (514, 528, 7, 10) Reed-Solomon code. That is, codewords have a length of n=528 symbols, of which k=514 are data symbols and for which there are m=10 bits per symbol. Thus, the code is capable of correcting up to (n−k)/2=7 symbol errors per codeword. Further, because m=10, a bus width of the decoder, measured in bits, should also be divisible by 10. Accordingly, a sample list of bus widths and clock rates achieving an output of approximately 103.125 Gbps from a Reed-Solomon decoder is as follows

| Bus width of Reed-Solomon decoder (symbols) | Bus width of Reed-Solomon decoder (bits) | Clock Rate of Reed-Solomon Decoder (MHz) |
| --- | --- | --- |
| 66 | 660 | 156.3 |
| 44 | 440 | 234.4 |
| 33 | 330 | 312.5 |
| 22 | 220 | 468.8 |
| 16 | 160 | 644.5 |

As would be understood by one of ordinary skill, based on the disclosure and teachings herein, the size of a Reed-Solomon decoder is approximately proportional to the bus width of the Reed-Solomon decoder. Therefore, the table above reflects a tradeoff that exists between a size of a Reed-Solomon decoder and a maximum required clock rate of the decoder.

Figure 2:
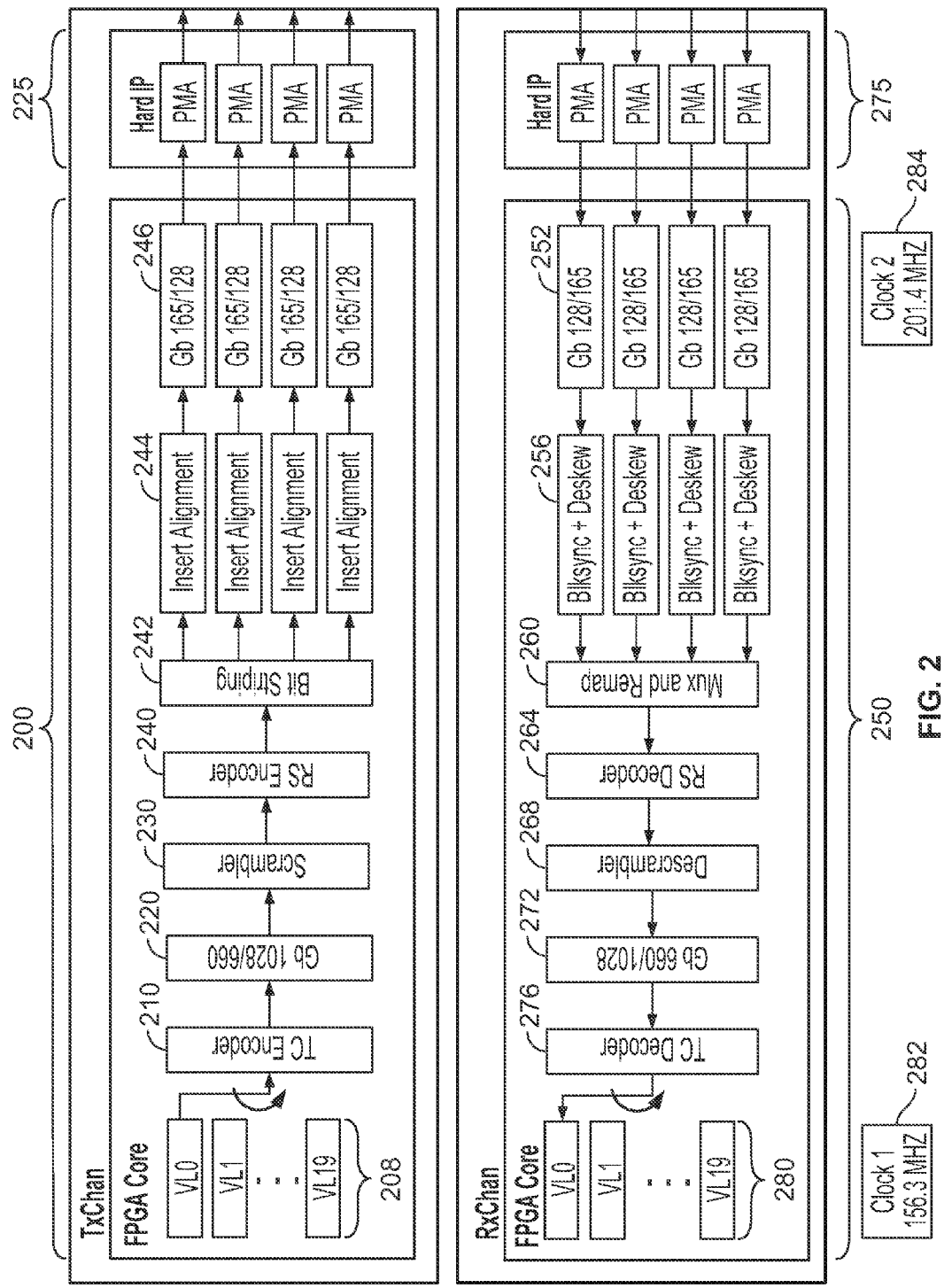
FIG. 2 is a schematic diagram of a PCS transmit and a PCS receive architecture employing Reed-Solomon encoding and decoding at a bus width of 66 symbols and a clock frequency of 156.3 MHz in accordance with an arrangement.

FIG. 2 is a schematic diagram of a PCS transmit and a PCS receive architecture employing Reed-Solomon encoding and decoding, respectively, at a bus width of 66 symbols and a clock frequency of 156.3 MHz in accordance with an arrangement. In an arrangement, the PCS transmit architecture 200 and PCS receive architecture 250 are each implemented in the soft IP of a PLD or other programmable device. The PMA transmit architecture 225 and PMA receive architecture 275 are each implemented in the hard IP of a PLD or other programmable device. Per the IEEE 802.3bj standard, and as depicted in FIG. 2, each of the PMA transmit architecture 225 and the PMA receive architecture 275 uses four physical lanes at a line rate of 25.78 Gbps each.

Turning to the PCS transmit architecture 200, the transcoding encoder 210 accepts input data from 20 virtual channels of virtual channels 205 at a clock frequency of 156.3 MHz. Specifically, the transcoding encoder 210 accepts data from the virtual lanes 205 one block at a time, in a round-robin fashion across the 20 virtual lanes of the virtual lanes 205. Further, because the PCS transmit architecture 200 operates according to a bus width of 660 bits, each block provided to the transcoding encoder 210 is 66 bits in length (i.e., the length of each block is one-tenth the bus width value). In other words, during a "cycle," the transcoding encoder 210 first receives 66 bits from virtual channel 1, then 66 bits from virtual channel 2, and so on. After the transcoding encoder 210 collects 1056 bits (i.e., corresponding to sixteen blocks), the transcoding encoder 210 encodes the input data to produce 1028 output bits at the clock frequency of 156.3 MHz. The output of the transcoding encoder 210 is provided to gearbox 220.

The gearbox 220 receives the output of the transcoding encoder 210 at a width of 1028 bits per virtual channel and the clock frequency of 156.3 MHz and outputs data at a width of 660 bits per virtual channel and the clock frequency of 156.3 MHz. The scrambler 230 accepts the input from the gearbox 220 and scrambles the input bits of data with the purpose of producing as output a more even distribution of '1' valued bits and '0' valued bits throughout the output data. The scrambler 230 may be implemented using a linear feedback shift register. The scrambler 230 outputs data at a width of 660 bits per virtual channel and the clock frequency of 156.3 MHz.

Next, the scrambler output is provided to the Reed-Solomon encoder 240 also at a width of 660 bits per virtual channel and the clock frequency of 156.3 MHz. The Reed-Solomon encoder 240 encodes the input according to a (514, 528, 7, 10) Reed-Solomon code, as discussed above, to produce output encoded data at a width of 660 bits per virtual channel and the clock frequency of 156.3 MHz. The input and output rates of the Reed-Solomon encoder 240 are the same because the input to the Reed-Solomon encoder includes blank (or null) bit positions corresponding to code bits that are eventually added by the Reed-Solomon encoder 240 prior to output.

The output of the Reed-Solomon encoder 240 is provided to a bit striper 242. As depicted in FIG. 2, the bit striper 242 converts a single physical stream of input data into four physical output streams of data. Further, each output stream operates at one fourth the rate of the input stream, i.e., each output of the bit striper 250 is at a bit width of 165 bits per virtual channel and the clock frequency of 156.3 MHz. In certain implementations, the bit striper 250 allocates input bits to the four output streams in a round-robin fashion.

The components at a first of the four output streams of the bit striper 250, i.e., insert alignment module 244 and gearbox 246, are described next (the like components of the three other output streams follow a similar description). The insert alignment module 244 inserts alignment markers into its input. In certain arrangements, the insert alignment module 244 inserts markers (e.g., blocks of data) periodically into each input virtual lane after every (roughly) 16,000 blocks. The inserted markers may be used to deskew virtual channels at a receiver, i.e., to line up virtual channels and correct for any misalignment among the virtual channels in received data.

The output of the insert alignment module 244 is provided at a bit-width of 165 bits per virtual channel and the clock frequency of 156.3 MHz to the gearbox 246. The gearbox 246 receives the output of the insert alignment module 244 at a width of 165 bits per virtual channel and the clock frequency of 156.3 MHz and outputs data at a width of 128 bits per virtual channel and the clock frequency of 201.4 MHz. This output is then provided to a corresponding first physical lane of the PMA transmit architecture 225.

The PCS receive architecture 250 essentially reverses the operations performed by corresponding components of the PCS transmit architecture 200. Specifically, the PMA receive architecture 275 provides data on four physical streams, each at bit width of 128 bits per virtual channel and a clock frequency of 201.1 MHz. Each data stream is provided to a corresponding gearbox. For example, considering the first of the four data streams, this data stream is provided to the gearbox 252. The gearbox 252 receives its input at a width of 128 bits per virtual channel and the clock frequency of 201.4 MHz and converts the data to an output bit width of 165 bits per virtual channel and at the clock frequency of 156.3 MHz.

The output of the gearbox 252 is provided to the block synchronization and deskew module 256. The block synchronization and deskew module 256 uses the markers previously embedded by the insert alignment module 244 from the PCS transmit architecture 200 to remove any skew in the received data. After this operation, the block synchronization and deskew module 256 removes the alignment markers from its input data and provides its output, at a bit-width of 165 bits per virtual channel and a clock frequency of 156.3 MHz, to multiplexer and remapping module 260. As the gearboxes and block synchronization and deskew modules corresponding to each of the three other physical streams output by the PMA receive architecture 275 operate similarly to the gearbox 252 and the block synchronization and deskew module 256, respectively, a further description is omitted.

The multiplexer and remapping module 260 performs the reverse operation of the bit striper 242. In particular, as depicted in FIG. 2, the multiplexer and remapping module 260 converts its input four streams of data input into a single stream of data operating at four times the rate of any single input stream. Thus, the output of the multiplexer and remapping module 260 is at a bit width of 660 bits per virtual channel and a clock frequency of 156.3 MHz.

Reed-Solomon decoder 264 and descrambler 268 perform the reverse operations of the Reed-Solomon encoder 240 and scrambler 230, respectively, of the PCS transmit architecture 200. Further, each of the Reed-Solomon encoder 240 and the scrambler 230 operate with an input and output bit-width of 660 bits per virtual channel and at the clock frequency of 156.3 MHz.

The gearbox 272 reverses the operation performed by the gearbox 220 of the PCS transmit architecture 200. In particular, the gearbox 272 receives the output of the descrambler 268 at a width of 660 bits per virtual channel and the clock frequency of 156.3 MHz and outputs the data at a width of 1028 bits per virtual channel and the clock frequency of 156.3 MHz.

Transcoding decoder 276 reverses the operation performed by the transcoding encoder 210 to produce a transcoded output at a bit width of 1056 bits per virtual channel and the clock frequency of 156.3 MHz. The output of the transcoding decoder 276 is provided to 20 virtual lanes 280 one block at a time, in a round-robin fashion. Further, because the PCS receive architecture 250 operates according to a bus width of 66 symbols, each block provided to the virtual lanes 280 is 66 symbols in length.

As described above, each of the components shown in FIG. 3 operates either at a clock frequency of 156.3 MHz or at a clock frequency of 201.4 MHz. In an arrangement, each of these clock signals is derived from a clock signal from the clock distribution area 19 depicted in FIG. 1. In particular, in this arrangement, signals from a clock 1 282 and clock 2 284 of the clock distribution area 19 clock the corresponding components of the PCS transmit architecture 200 and the PCS receive architecture 250.

It should be noted that in the PCS transmit architecture 200 and PCS receive architecture 250 shown above, that the block size of 528 symbols is an integer multiple of the word size of 66 symbols. Further, the elements of the Reed-Solomon encoder 240 and the Reed-Solomon decoder 264 process 66 symbols in parallel.

Figure 3:
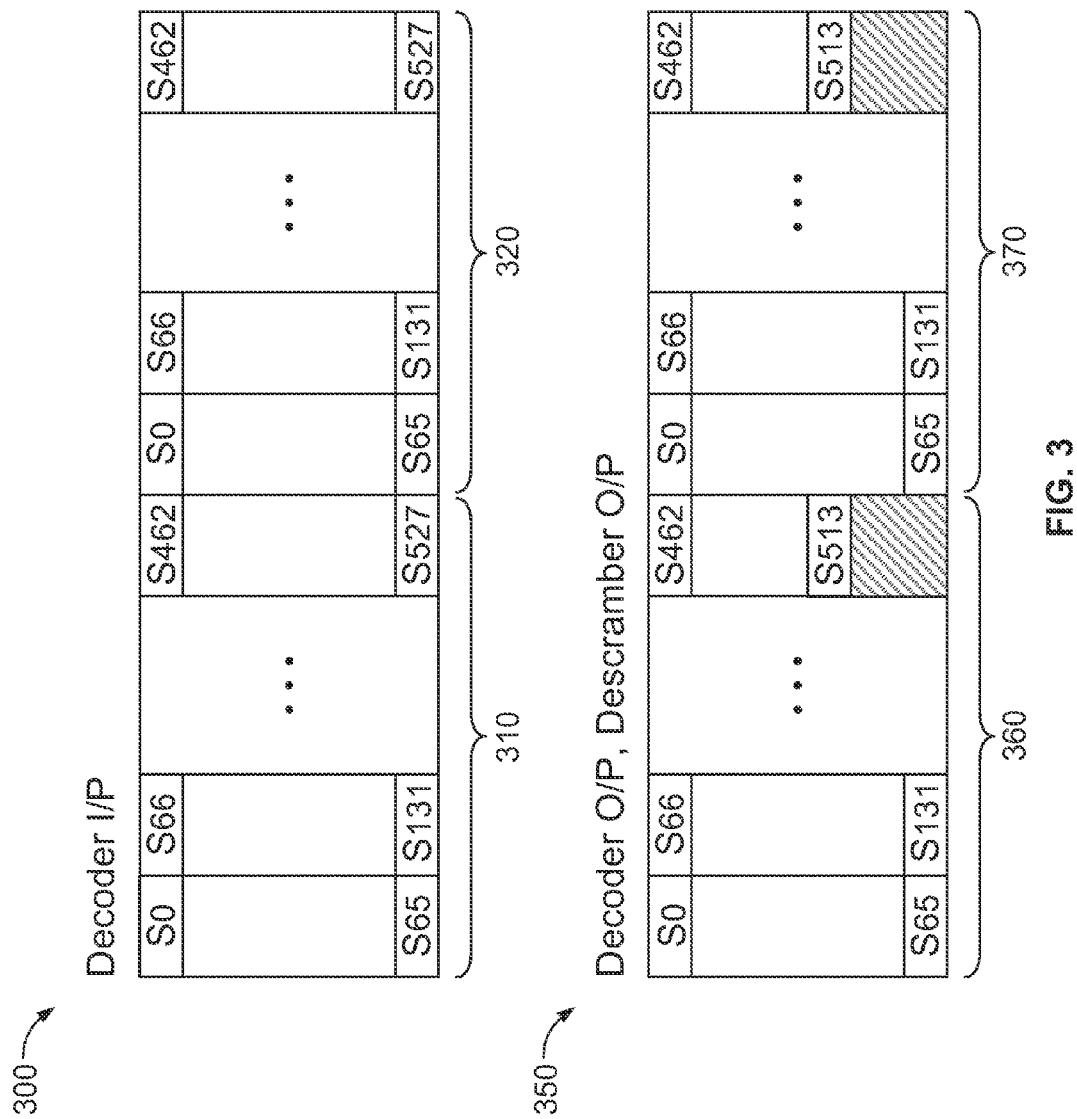
FIG. 3 illustrates a data flow for an input and an output of a Reed-Solomon decoder and an output of a descrambler in accordance with an arrangement.

FIG. 3 illustrates a data flow for an input and an output of the Reed-Solomon decoder 264 of FIG. 2 and an output of the descrambler 268 of FIG. 2 in accordance with an arrangement. Timing diagram 300 illustrates a manner in which blocks of data are processed at the input of the Reed-Solomon decoder 264. In particular, the 528 symbols of a single Reed-Solomon codeword are processed using the 66 bit width input of the Reed-Solomon decoder 264 and, therefore, as depicted in FIG. 3, a Reed-Solomon codeword is read over a total of 264/66=8 clock cycles 310. Similarly, a second Reed-Solomon codeword is read by the Reed-Solomon decoder 264 over a next period of eight clock cycles 320.

Timing diagram 350 illustrates a manner in which blocks of data are processed at the output of the Reed-Solomon decoder 264 (or equivalently, at the output of the descrambler 268). In particular, the Reed-Solomon decoder 264 outputs only 514 symbols for every 528 input symbols. Thus, as illustrated by clock cycles 360, there is no output over a fraction of the eighth and final clock cycle of clock cycles 360 corresponding to each decoded output codeword. In particular, there is no data output by the Reed-Solomon decoder 264 over the final 14 symbol slots, which amounts to approximately ~21 percent of the last clock cycle of clock cycles 360. A second Reed-Solomon codeword is similarly output from the Reed-Solomon decoder 264 over a next period of eight clock cycles as depicted by clock cycles 370.

As would be understood by one of ordinary skill in the art, based on the disclosure and teachings herein, a time delay exists between the input of a particular block to the Reed-Solomon decoder 264 and a corresponding output block (similarly, a time delay exists between the input of a particular block to the Reed-Solomon encoder 240 and a corresponding output of the particular block). However, this time delay is not explicitly shown in the timing diagrams 300 and 350 for simplicity of presentation. Further, it would be understood by one of ordinary skill in the art, based on the disclosure and teachings herein, that an input to the Reed-Solomon encoder 240 is represented similarly to that of the timing diagram 350, and that an output of the Reed-Solomon encoder 240 is represented similarly to that of the timing diagram 300.

Figure 4:
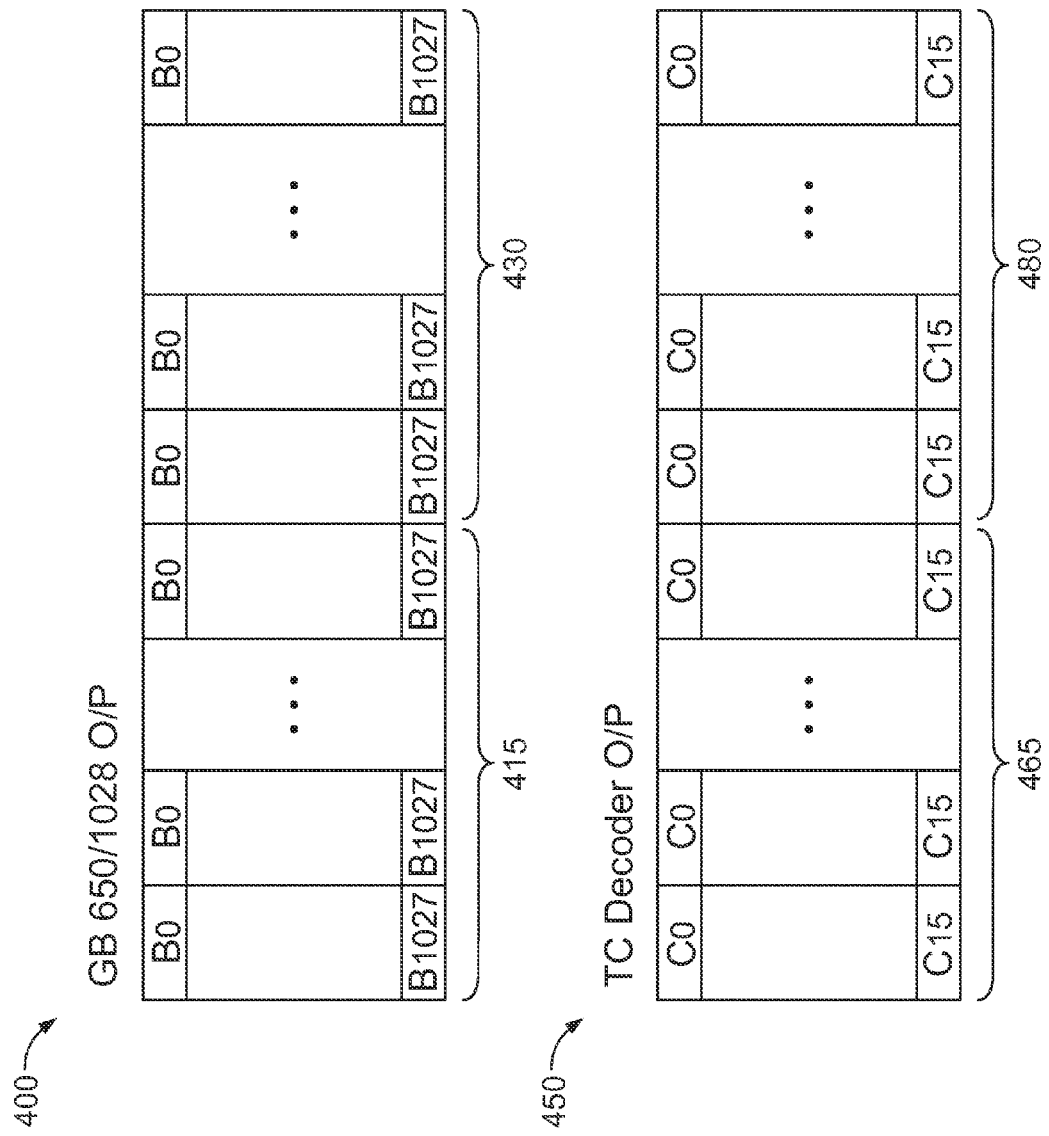
FIG. 4 illustrates a data flow for an output of a gearbox and a transcoding decoder in accordance with an arrangement.

FIG. 4 illustrates a data flow for an output of the gearbox 272 of FIG. 2 and the transcoding decoder 276 of FIG. 2 in accordance with an arrangement. In particular, the timing diagram 400 shows a manner of data flow for the output of the gearbox 272 and the timing diagram 450 shows a manner of data flow for the output of the transcoding decoder 276.

As described in relation to FIG. 2, above, the gearbox 272 outputs a parallel bit stream at a bit width of 1028 bits per virtual channel. Thus, it takes five clock cycles for the gearbox 272 to output the bits corresponding to a Reed-Solomon codeword (since each decoded Reed-Solomon codeword is 5140 bits in length). This is shown by the five clock cycles 415 of the timing diagram 400. Similarly, it takes another five clock cycles for the gearbox 272 to output the bits of a next Reed-Solomon codeword as shown by the five clock cycles 430 of the timing diagram 400.

Turning to the timing diagram 450, each PCS codeword is a 66 bit width codeword. Accordingly, the transcoding decoder 276 outputs a total of 16 codewords per clock cycle (for a total of 16×66=1056 output bits per clock cycle), and thus, it takes a total of five clock cycles for the transcoding decoder 276 to output all the bits corresponding to a single 5014 bit decoded Reed-Solomon codeword. This is depicted by the five clock cycles 465 of the timing diagram 400. Similarly, it takes another five clock cycles for the transcoding decoder 276 to output the bits corresponding a next Reed-Solomon codeword as shown by the five clock cycles 480 of the timing diagram 400.

Figure 5:
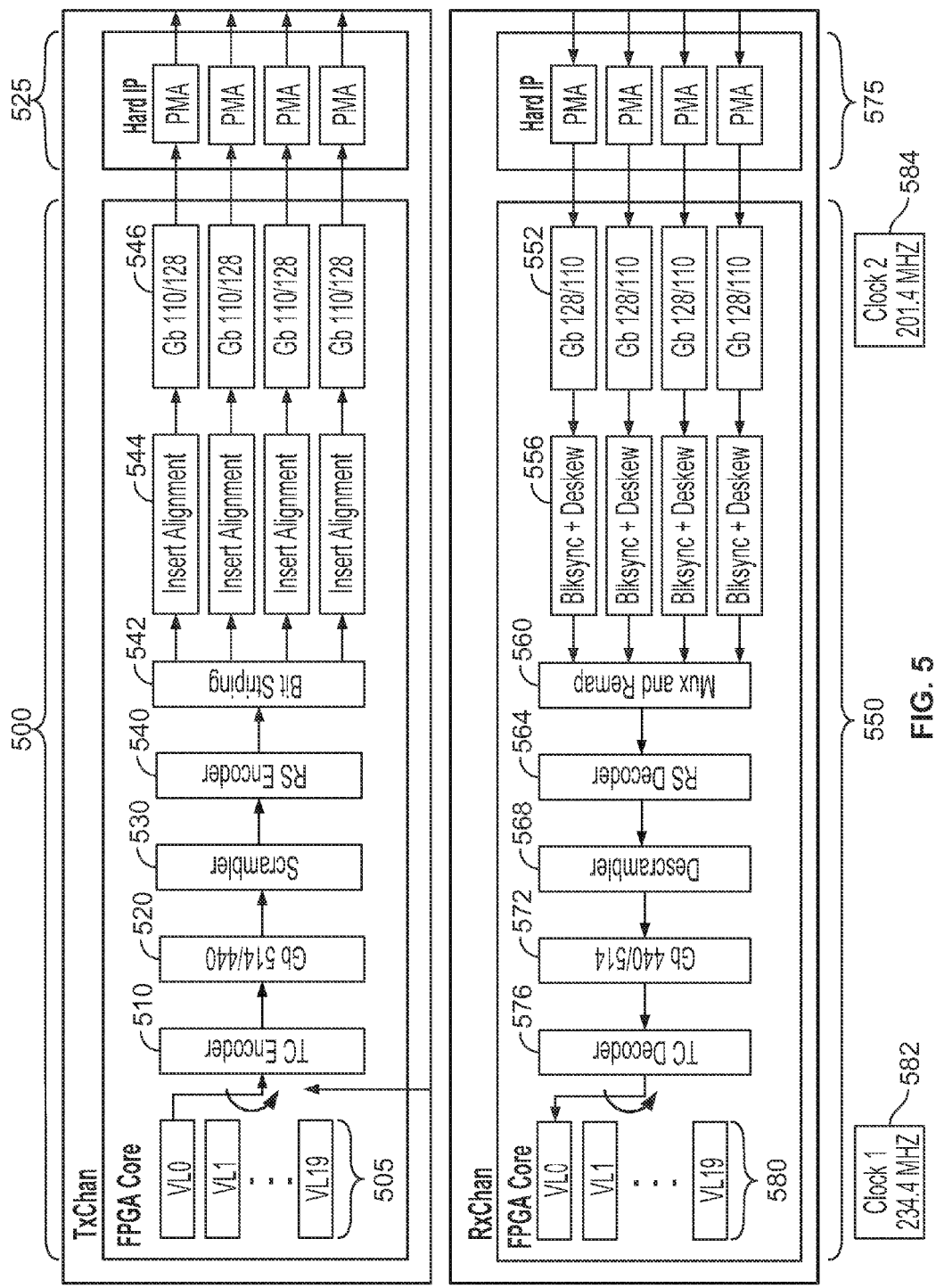
FIG. 5 is a schematic diagram of a PCS transmit and a PCS receive architecture employing Reed-Solomon encoding and decoding at a bus width of 44 symbols and a clock frequency of 234.4 MHz in accordance with an arrangement.

FIG. 5 is a schematic diagram of a PCS transmit and a PCS receive architecture employing Reed-Solomon encoding and decoding at a bus width of 44 symbols and a clock frequency of 234.4 MHz in accordance with an arrangement. In an arrangement, the PCS transmit architecture 500 and PCS receive architecture 550 are each implemented in the soft IP of a PLD or other programmable device. The PMA transmit architecture 525 and PMA receive architecture 575 are each implemented in the hard IP of a PLD or other programmable device. Per the IEEE 802.3bj standard, and as depicted in FIG. 5, each of the PMA transmit architecture 525 and the PMA receive architecture 575 uses four physical lanes at 25.78 Gbps each.

The PCS transmit architecture 500 and PCS receive architecture 550 include similar components to the PCS transmit architecture 200 and PCS receive architecture 250, respectively, of FIG. 2, but which operate at different bit widths and clock rates. Accordingly, the following table lists components of the PCS transmit architecture 500, their similar (i.e., corresponding) elements in the PCS transmit architecture 200, and the input and output bit widths and clock rate of the components of the PCS transmit architecture 500

| Component of PCS transmit architecture 500 | Corresponding Component of PCS transmit architecture 200 | Input bit width (bits) | Input frequency (MHz) | Output bit width (bits) | Output Frequency (MHz) |
|---|---|---|---|---|---|
| Virtual lanes 505 | Virtual lanes 205 | | | 528 | 234.4 |
| transcoding encoder 510 | transcoding encoder 210 | 528 | 234.4 | 514 | 234.4 |
| gearbox 520 | gearbox 220 | 514 | 234.4 | 440 | 234.4 |
| scrambler 530 | scrambler 230 | 440 | 234.4 | 440 | 234.4 |
| Reed-Solomon encoder 540 | Reed-Solomon encoder 240 | 440 | 234.4 | 440 | 234.4 |
| bit striper 542 | bit striper 242 | 440 | 234.4 | 110 | 234.4 |
| insert alignment module 544 | insert alignment module 244 | 110 | 234.4 | 110 | 234.4 |
| gearbox 546 | gearbox 246 | 110 | 234.4 | 128 | 201.4 |

Similarly, the following table lists components of the PCS receive architecture 550, their similar (i.e., corresponding) elements in the PCS receive architecture 250, and the input and output bit widths and clock rate of the components of the PCS receive architecture 550

| Component of PCS receive architecture 550 | Corresponding Component of PCS receive architecture 250 | Input bit width (bits) | Input frequency (MHz) | Output bit width (bits) | Output Frequency (MHz) |
|---|---|---|---|---|---|
| gearbox 552 | gearbox 252 | 128 | 201.4 | 110 | 234.4 |
| block synchronization and deskew module 556 | block synchronization and deskew module 256 | 110 | 234.4 | 110 | 234.4 |
| multiplexer and remapping module 560 | multiplexer and remapping module 260 | 440 | 234.4 | 440 | 234.4 |
| Reed-Solomon decoder 564 | Reed-Solomon decoder 264 | 440 | 234.4 | 440 | 234.4 |
| descrambler 568 | descrambler 268 | 440 | 234.4 | 440 | 234.4 |
| gearbox 572 | gearbox 272 | 440 | 234.4 | 514 | 234.4 |
| transcoding decoder 576 | transcoding decoder 276 | 514 | 234.4 | 528 | 234.4 |
| Virtual lanes 580 | Virtual lanes 280 | 528 | 234.4 | | |

As described above, each of the components shown in FIG. 5 operates either at a clock frequency of 234.4 MHz or at a clock frequency of 201.4 MHz. In an arrangement, each of these clock signals is derived from a clock signal from the clock distribution area 19 depicted in FIG. 1. In particular, in this arrangement, signals from a clock 1 582 and clock 2 584 of the clock distribution area 19 clock the corresponding components of the PCS transmit architecture 500 and the PCS receive architecture 550.

Figure 6:
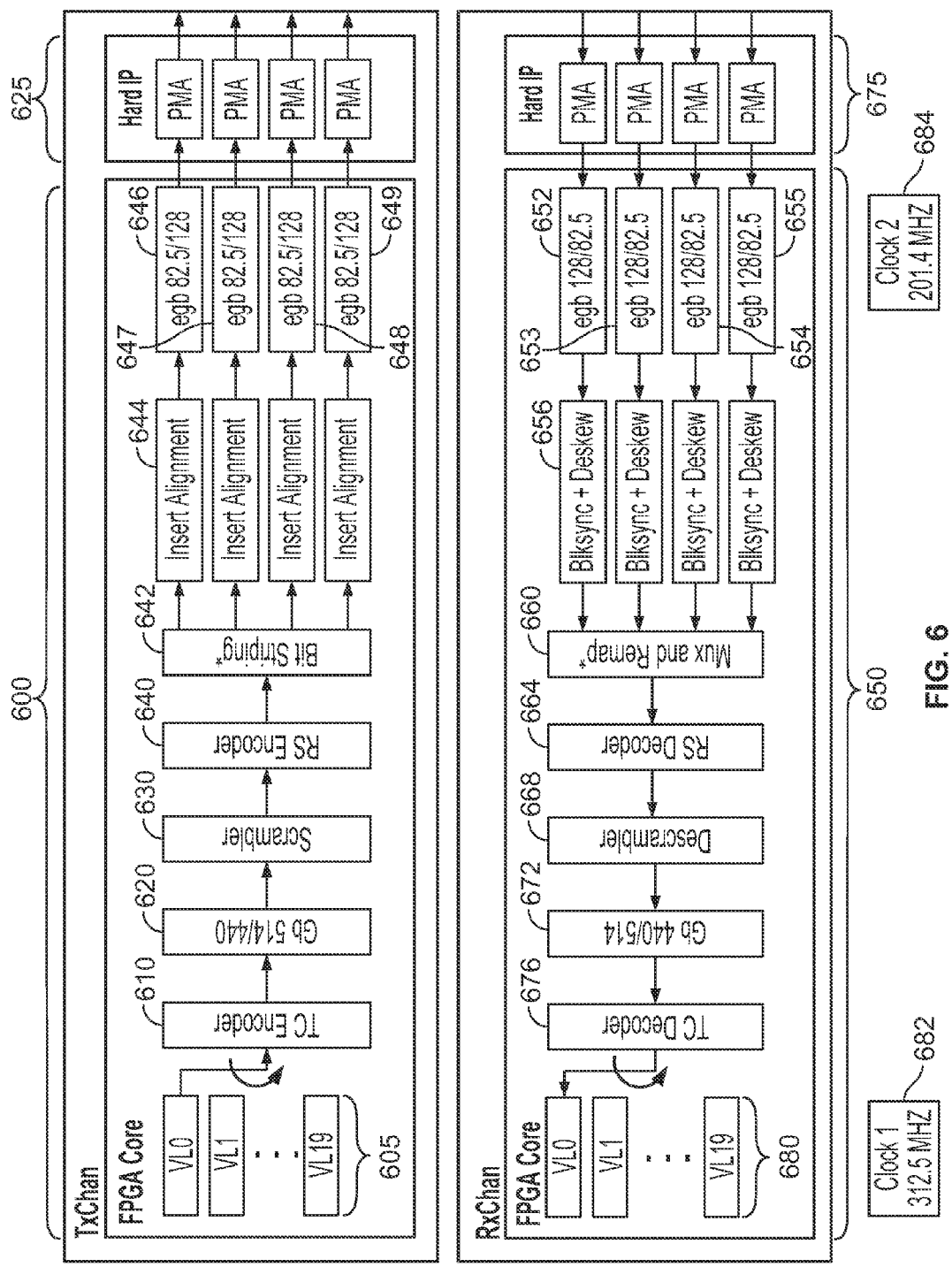
FIG. 6 is a schematic diagram of a PCS transmit and a PCS receive architecture employing Reed-Solomon encoding and decoding at a bus width of 33 symbols and a clock frequency of 312.5 MHz in accordance with an arrangement.

FIG. 6 is a schematic diagram of a PCS transmit and a PCS receive architecture employing Reed-Solomon encoding and decoding at a bus width of 33 symbols and a clock frequency of 312.5 MHz in accordance with an arrangement. In an arrangement, the PCS transmit architecture 600 and PCS receive architecture 650 are each implemented in the soft IP of a PLD or other programmable device. The PMA transmit architecture 625 and PMA receive architecture 675 are each implemented in the hard IP of a PLD or other programmable device. Per the IEEE 802.3bj standard, and as depicted in FIG. 6, each of the PMA transmit architecture 625 and the PMA receive architecture 675 uses four physical lanes at 25.78 Gbps each.

The soft-IP architecture of the PMA transmit architecture 625 and PMA receive architecture 675 depicted in FIG. 6 operates at 300+MHz (i.e., 312.5 MHz), but results in a bus bit width that is not divisible by four (i.e., a bus bit width of 330 bits). Thus, the use of four conventional gearboxes in the PCS transmit architecture 600 would not able to provide a suitable output to the PMA transmit architecture 625. Accordingly, the PCS transmit architecture 600, and PCS receive architecture 650, instead employ an "elastic gearbox" architecture, which is further described below.

The PCS transmit architecture 600 and PCS receive architecture 650 include similar components to the PCS transmit architecture 200 and PCS receive architecture 250, respectively, of FIG. 2, but which operate at different bit widths and clock rates. Accordingly, the following table lists components of the PCS transmit architecture 600 (gearbox 646, and the three gearboxes parallel to the gearbox 646, are discussed separately below), their similar (i.e., corresponding) elements in the PCS transmit architecture 200, and the input and output bit widths and clock rate of the components of the PCS transmit architecture 600

| Component of PCS transmit architecture 600 | Corresponding Component of PCS transmit architecture 200 | Input bit width (bits) | Input frequency (MHz) | Output bit width (bits) | Output Frequency (MHz) |
|---|---|---|---|---|---|
| Virtual lanes 605 | Virtual lanes 205 | | | 512 | 312.5 |
| transcoding encoder 610 | transcoding encoder 210 | 512 | 312.5 | 514 | 312.5 |
| gearbox 620 | gearbox 220 | 514 | 312.5 | 330 | 312.5 |
| scrambler 630 | scrambler 230 | 330 | 312.5 | 330 | 312.5 |
| Reed-Solomon encoder 640 | Reed-Solomon encoder 240 | 330 | 312.5 | 330 | 312.5 |
| bit striper 642 | bit striper 242 | 330 | 312.5 | 83 | 312.5 |
| insert alignment module 644 | insert alignment module 244 | 83 | 312.5 | 83 | 312.5 |

Similarly, the following table lists components of the PCS receive architecture 650, their similar (i.e., corresponding) elements in the PCS receive architecture 250, and the input and output bit widths and clock rate of the components of the PCS receive architecture 650

| Component of PCS receive architecture 650 | Corresponding Component of PCS receive architecture 250 | Input bit width (bits) | Input frequency (MHz) | Output bit width (bits) | Output Frequency (MHz) |
|---|---|---|---|---|---|
| block synchronization and deskew module 656 | block synchronization and deskew module 256 | | | 83 | 312.5 |
| multiplexer and remapping module 660 | multiplexer and remapping module 260 | 330 | 312.5 | 330 | 312.5 |
| Reed-Solomon decoder 664 | Reed-Solomon decoder 264 | 330 | 312.5 | 330 | 312.5 |
| descrambler 668 | descrambler 268 | 330 | 312.5 | 330 | 312.5 |
| gearbox 672 | gearbox 272 | 330 | 312.5 | 514 | 312.5 |
| transcoding decoder 676 | transcoding decoder 276 | 514 | 312.5 | 512 | 312.5 |
| Virtual lanes 680 | Virtual lanes 280 | 512 | 312.5 | | |

As described above, each of the components shown in FIG. 6 operates either at a clock frequency of 312.5 MHz or at a clock frequency of 201.4 MHz. In an arrangement, each of these clock signals is derived from a clock signal from the clock distribution area 19 depicted in FIG. 1. In particular, in this arrangement, signals from a clock 1 682 and clock 2 684 of the clock distribution area 19 clock the corresponding components of the PCS transmit architecture 600 and the PCS receive architecture 650.

Each of the four PMA lanes of the PMA transmit architecture 625 is designed to receive one fourth of the total output of 330 bits per clock cycle, or, on average, 82.5 bits per clock cycle. As noted above, the gearboxes of the PCS transmit architecture 600 employ an elastic gearbox design to meet this requirement. In particular, gearboxes 646 and 647 output 83 bits during even clock cycles and 82 bits during odd clock cycles, while gearboxes 648 and 649 output 82 bits at even clock cycles and 83 bits at odd clock cycles. Using this elastic gearbox design, a total of exactly 330 bits is provided to the PMA transmit architecture 625 across the four gearboxes 646, 647, 648, and 649 every clock period, as required.

Turning to the PCS receive architecture 650, the gearboxes 652, 653, 654, and 655 output data corresponding to the elastic gearboxing scheme as well. In particular, gearboxes 652 and 653 output 83 bits during even clock cycles and 82 bits during odd clock cycles, while gearboxes 654 and 655 output 82 bits at even clock cycles and 83 bits at odd clock cycles. As would be understood by one of ordinary skill in the art, based on the disclosure and teachings herein, the "even" clock cycles of the gearboxes 646, 647, 648, and 649 of the PCS transmit architecture 600 may or may not correspond to the "even" clock cycles of the gearboxes 652, 653, 654, and 655 (and may instead correspond to the "odd" clock cycles of the of the gearboxes 652, 653, 654, and 655). In particular, whether there is a correspondence depends at least on a propagation and synchronization delay time for sending data from the PMA transit architecture 625 to the PMA receive architecture 675.

Figure 7:
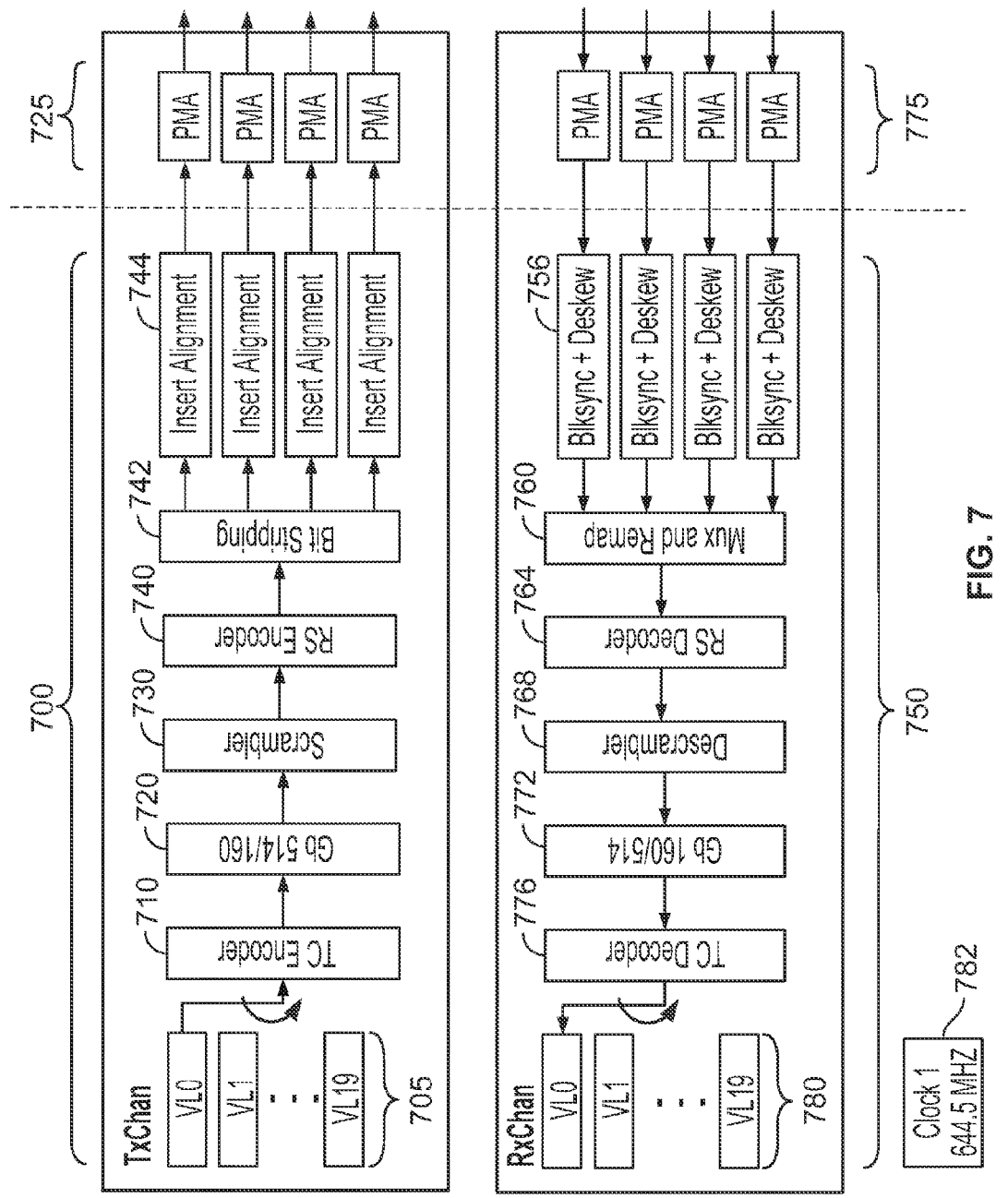
FIG. 7 is a schematic diagram of a PCS transmit and a PCS receive architecture employing Reed-Solomon encoding and decoding at a bus width of 16 symbols and a clock frequency of 644.5 MHz in accordance with an arrangement.

FIG. 7 is a schematic diagram of a PCS transmit and a PCS receive architecture employing Reed-Solomon encoding and decoding at a bus width of 16 symbols and a clock frequency of 644.5 MHz in accordance with an arrangement. The PCS transmit architecture 700, PMA transmit architecture 725, PCS receive architecture 750, and PMA receive architecture 775 are each implemented in the hard IP of a PLD or other programmable device. Per the IEEE 802.3bj standard, and as depicted in FIG. 7, each of the PMA transmit architecture 725 and the PMA receive architecture 775 uses four physical lanes at 25.78 Gbps each.

The PCS transmit architecture 700 and PCS receive architecture 750 include components that are functionally similar to components of the PCS transmit architecture 200 and PCS receive architecture 250, respectively, of FIG. 2, with the following differences. First, each of the components of the PCS transmit architecture 700 and PCS receive architecture 750 are implemented in hard IP whereas the PCS transmit architecture 200 and PCS receive architecture 250 of FIG. 2 are implemented in soft IP. Second, the components of the PCS transmit architecture 700 and PCS receive architecture 750 generally operate at different bit widths and clock rates that like components of the PCS transmit architecture 200 and PCS receive architecture 250 of FIG. 2. In particular, the following table lists components of the PCS transmit architecture 700, their similar (i.e., corresponding) elements in the PCS transmit architecture 200, and the input and output bit widths and clock rate of the components of the PCS transmit architecture 700

| Component of PCS transmit architecture 700 | Corresponding Component of PCS transmit architecture 200 | Input bit width (bits) | Input frequency (MHz) | Output bit width (bits) | Output Frequency (MHz) |
|---|---|---|---|---|---|
| Virtual lanes 705 | Virtual lanes 205 | | | 528 | 644.5 |
| transcoding encoder 710 | transcoding encoder 210 | 528 | 644.5 | 514 | 644.5 |
| gearbox 720 | gearbox 220 | 514 | 644.5 | 160 | 644.5 |
| scrambler 730 | scrambler 230 | 160 | 644.5 | 160 | 644.5 |
| Reed-Solomon encoder 740 | Reed-Solomon encoder 240 | 160 | 644.5 | 160 | 644.5 |
| bit striper 742 | bit striper 242 | 160 | 644.5 | 40 | 644.5 |
| insert alignment module 744 | insert alignment module 244 | 40 | 644.5 | 40 | 644.5 |

Similarly, the following table lists components of the PCS receive architecture 750, their similar (i.e., corresponding) elements in the PCS receive architecture 250, and the input and output bit widths and clock rate of the components of the PCS receive architecture 750

| Component of PCS receive architecture 750 | Corresponding Component of PCS receive architecture 250 | Input bit width (bits) | Input frequency (MHz) | Output bit width (bits) | Output Frequency (MHz) |
|---|---|---|---|---|---|
| block synchronization and deskew module 756 | block synchronization and deskew module 256 | 40 | 644.5 | 40 | 644.5 |
| multiplexer and remapping module 760 | multiplexer and remapping module 260 | 160 | 644.5 | 160 | 644.5 |
| Reed-Solomon decoder 764 | Reed-Solomon decoder 264 | 160 | 644.5 | 160 | 644.5 |
| descrambler 768 | descrambler 268 | 160 | 644.5 | 160 | 644.5 |
| gearbox 772 | gearbox 272 | 160 | 644.5 | 514 | 644.5 |
| transcoding decoder 776 | transcoding decoder 276 | 514 | 644.5 | 528 | 644.5 |
| Virtual lanes 780 | Virtual lanes 280 | 528 | 644.5 | | |

Thus, each of the components of the PCS transmit architecture 700 and PCS receive architecture 750 operate at a clock frequency of 644.5 MHz.

Third, in contrast to the PCS transmit architecture 200 and PCS receive architecture 250 of FIG. 2, the PCS transmit architecture 700 and PCS receive architecture 750 are each implemented without the use of gearboxes that directly interface with PMA transmit and receive circuitry. This is because the hard IP implementation allows for a sufficiently large bandwidth (i.e., 644.5 MHz) that the output of the Reed-Solomon encoder 740 is matched exactly with the PMA interface. For example, the output of 40 bits at 644.5 MHz from the insert alignment module 744 provides an output of approximately 25.78 Gbps that is matched to the input of a corresponding physical lane of the PMA transmit interface 725.

As described above, each of the components shown in FIG. 7 operates at a clock frequency of 644.5 MHz. In an arrangement, this clock signal is derived from a clock signal from the clock distribution area 19 depicted in FIG. 1. In particular, in this arrangement, signals from a clock 1 782 of the clock distribution area 19 clock the corresponding components of the PCS transmit architecture 700 and the PCS receive architecture 750.

Figure 8:
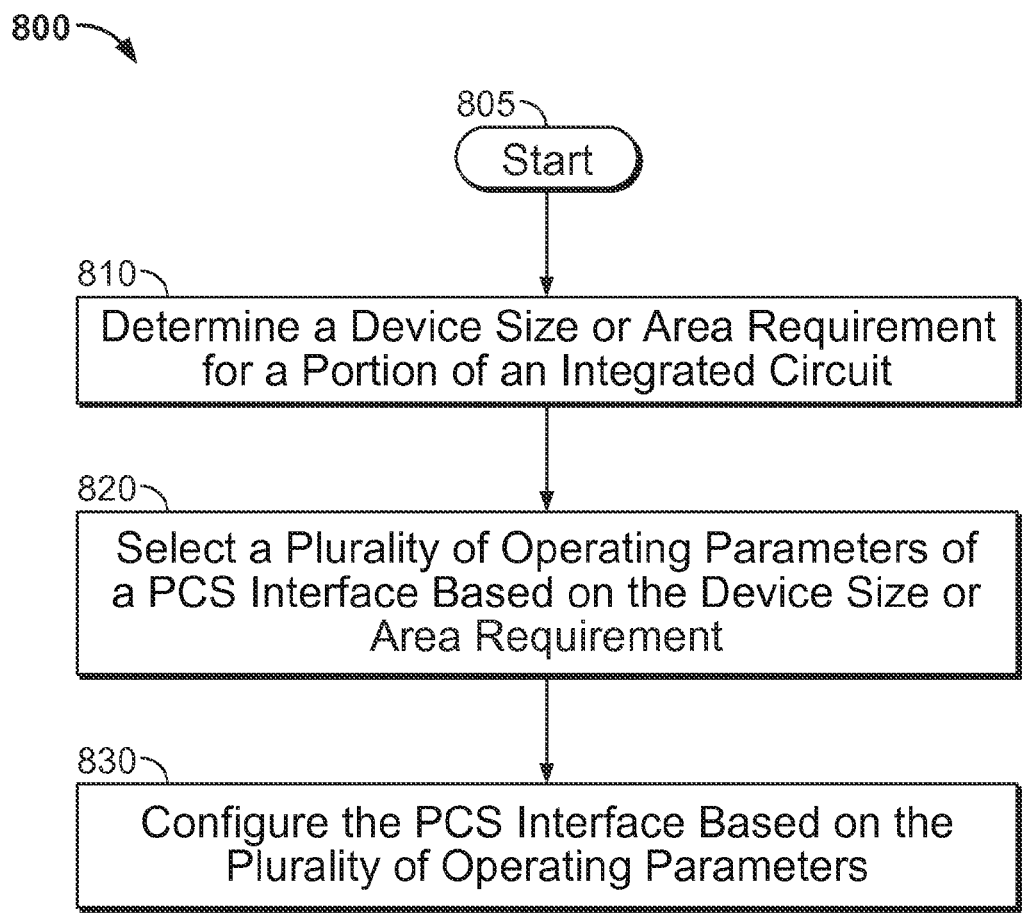
FIG. 8 depicts an illustrative process for configuring a PCS interface of an integrated circuit device in accordance with an arrangement.

FIG. 8 depicts an illustrative process for configuring a PCS interface of an integrated circuit device in accordance with an arrangement. Process 800 starts at 805. At 810, a device size or area requirement for a portion of the integrated circuit is determined. For example, in some arrangements, the device size or area requirement is a bus width of an encoder or decoder included in the integrated circuit. Further, in some arrangements, the bus width is selected from bus widths of 22 symbols, 33 symbols, 44 symbols, and 66 symbols.

At 820, a plurality of operating parameters of the PCS interface based on the device size or area requirement are selected. For example, in some arrangements, the plurality of operating parameters comprises a maximum bandwidth parameter for the PCS interface. Further, in some arrangements, the maximum bandwidth parameter is selected from bandwidths of 156.3 MHz, 234.4 MHz, 312.5 MHz, and 468.8 MHz.

At 830, the PCS interface is configured based on the plurality of operating parameters. For example, in some arrangements, configuring the PCS interface includes determining if a bus width of the PCS interface is divisible by a total number of physical lanes present in the PCS interface. Further, in some arrangements, configuring the PCS interface includes configuring the gearboxes present in the PCS interface in an elastic gearbox design in response to a determination that the bus width of the PCS interface is not divisible by the number of gearboxes present in the PCS interface.

It will be understood by one of ordinary skill in the art that two or more of the architectures shown in FIGS. 1, 2, and 5-7 may be included in a single FPGA. For example, in an arrangement, a single FPGA includes two or more of PCS transmit architecture 200 (and correspondingly, PCS receive architecture 250), PCS transmit architecture 500 (and correspondingly, PCS receive architecture 550), PCS transmit architecture 600 (and correspondingly, PCS receive architecture 650), PCS transmit architecture 700 (and correspondingly, PCS receive architecture 750), and may include multiple instances of any particular type of architecture (e.g., multiple instances of PCS transmit architecture 200 and PCS receive architecture 250). Further, in some implementations, the FPGA is configured to serve multiple PMA interfaces simultaneously, where each PMA interface interfaces with one instance of a PCS transmit architecture and corresponding PCS receive architecture.

Further, it will be understood by one of ordinary skill in the art that some of may include additional test hardware. For example, any of the architectures described in FIGS. 1, 2, and 5-7 may include bypass circuitry (e.g., multiplexers) for bypassing pictured elements during test or diagnostic modes.

Further, it will be understood that the foregoing is only illustrative of the principles of the invention, and that various modifications may be made by those skilled in the art without departing from the scope and spirit of the invention, and the present invention is limited only by the claims that follow.

What is claimed is:

1. A soft-IP transmitter interface comprising:
    a Reed-Solomon encoder operating according to any one of a plurality of bus width and bandwidth parameter pairs;
    a gearbox module comprising a plurality of gearboxes, the plurality of gearboxes:
        receiving input data at a bus width and clock rate parameter pair specified by the transmitter interface; and
        converting the input data into output data according to a number of physical lanes and bandwidth parameter pair specified by a physical medium attachment (PMA) standard; and
    a transcoding encoder receiving, as input, block data from a plurality of virtual lanes according to a round-robin allocation.

2. The soft-IP transmitter interface of claim 1, wherein the plurality of bus width and bandwidth parameter pairs comprises a bus width of 66 symbols and a clock rate of 156.3 MHz, a bus width of 44 symbols and a clock rate of 234.4 MHz, a bus width of 33 symbols and a clock rate of 312.5 MHz, and a bus width of 22 symbols and a clock rate of 468.8 MHz.

3. The soft-IP transmitter interface of claim 1, wherein the PMA standard specifies the number of physical lanes to be four physical lanes and bandwidth parameter of 25.78 Gigabits per second per physical lane.

4. The soft-IP transmitter interface of claim 1, wherein a bus width specified by the transmitter interface is not divisible by a total number of physical lanes included in the gearbox module.

5. The soft-IP transmitter interface of claim 4, wherein the plurality of gearboxes comprises a first subplurality of gearboxes and a second subplurality of gearboxes, wherein, during even clock cycles:
    each gearbox in the first subplurality of gearboxes outputs a total number of N bits; and
    each gearbox in the second subplurality of gearboxes outputs a total number of N+1 bits.

6. The soft-IP transmitter interface of claim 5, wherein, during odd clock cycles:
    each gearbox in the first subplurality of gearboxes outputs a total number N+1 of bits; and
    each gearbox in the second subplurality of gearboxes outputs a total number N of bits.

7. A method for configuring a physical coding sublayer (PCS) interface of an integrated circuit device, the method comprising:
    determining a device size or area requirement for a portion of the integrated circuit;
    selecting a plurality of operating parameters of the PCS interface based on the device size or area requirement; and
    configuring the PCS interface based on the plurality of operating parameters, wherein the configuring comprises determining if a bus width of the PCS interface is divisible by a total number of physical lanes present in the PCS interface.

8. The method of claim 7, wherein the plurality of operating parameters comprises a maximum bandwidth parameter for the PCS interface.

9. The method of claim 8, wherein the maximum bandwidth parameter is selected from the group consisting of 156.3 MHz, 234.4 MHz, 312.5 MHz, and 468.8 MHz.

10. The method of claim 7, wherein the device size or area requirement is a bus width of an encoder or decoder included in the integrated circuit.

11. The method of claim 10, wherein the bus width is selected from the group consisting of 22 symbols, 33 symbols, 44 symbols, and 66 symbols.

12. The method of claim 7, wherein configuring the PCS interface comprises configuring the gearboxes present in the PCS interface in an elastic gearbox design in response to a determination that the bus width of the PCS interface is not divisible by the number of gearboxes present in the PCS interface.

13. A soft-IP receiver interface comprising:
    a Reed-Solomon decoder operating according to any one of a plurality of bus width and bandwidth parameter pairs;
    a gearbox module comprising a plurality of gearboxes, the plurality of gearboxes:
        receiving input data on a number of physical lanes and at a bandwidth per physical lane specified by a physical medium attachment (PMA) standard; and
        converting the input data into output data at a bus width and a clock rate specified by the receiver interface; and
    a transcoding decoder processing block data from a plurality of virtual lanes according to a round-robin allocation.

14. The soft-IP receiver interface of claim 13, wherein the plurality of bus width and bandwidth parameter pairs comprises a bus width of 66 symbols and a clock rate of 156.3 MHz, a bus width of 44 symbols and a clock rate of 234.4 MHz, a bus width of 33 symbols and a clock rate of 312.5 MHz, and a bus width of 22 symbols and a clock rate of 468.8 MHz.

15. The soft-IP receiver interface of claim 13, wherein the PMA standard specifies the number of physical lanes to be four physical lanes and bandwidth parameter of 25.78 Gigabits per second per physical lane.

16. The soft-IP receiver interface of claim 13, wherein a bus width specified by the receiver interface is not divisible by a total number of physical lanes included in the gearbox module.

17. The soft-IP receiver interface of claim 16, wherein the plurality of gearboxes comprises a first subplurality of gearboxes and a second subplurality of gearboxes, wherein, during even clock cycles:
    each gearbox in the first subplurality of gearboxes outputs a total number of N bits; and
    each gearbox in the second subplurality of gearboxes outputs a total number of N+1 bits.

18. The soft-IP receiver interface of claim 17, wherein, during odd clock cycles:
    each gearbox in the first subplurality of gearboxes outputs a total number N+1 of bits; and
    each gearbox in the second subplurality of gearboxes outputs a total number N of bits.

* * * * *